(12) United States Patent
Ogawa et al.

(10) Patent No.: US 12,713,845 B2
(45) Date of Patent: Aug. 18, 2026

(54) SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventors: Arito Ogawa, Toyama (JP); Koei Kuribayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 646 days.

(21) Appl. No.: 18/184,390

(22) Filed: Mar. 15, 2023

(65) Prior Publication Data

US 2023/0268181 A1 Aug. 24, 2023

Related U.S. Application Data

(63) Continuation of application No. PCT/JP2020/035478, filed on Sep. 18, 2020.

(51) Int. Cl.
*C23C 16/08* (2006.01)
*C23C 16/455* (2006.01)
*H10P 14/40* (2026.01)

(52) U.S. Cl.
CPC .............. *H10P 14/40* (2026.01); *C23C 16/08* (2013.01); *C23C 16/45527* (2013.01)

(58) Field of Classification Search
CPC .......................... C23C 16/08; C23C 16/45527
See application file for complete search history.

(56) References Cited

U.S. PATENT DOCUMENTS 10,276,393 B2 * 4/2019 Nakatani ........... H01L 21/28568
10,290,542 B2 * 5/2019 Nakatani ........... H01L 21/28562
10,510,590 B2 * 12/2019 Thombare ............ H10P 14/432
2006/0029748 A1 * 2/2006 Ishizaka ............. C23C 16/5096 257/E21.171

(Continued)

FOREIGN PATENT DOCUMENTS

CN 110268506 A 9/2019
JP 2011-066263 A 3/2011

(Continued)

OTHER PUBLICATIONS

Richey, Nathaniel E., et al., "Understanding chemical and physical mechanisms in atomic layer deposition". The Journal of Chemical Physics, 152, 040902, (2020), pp. 1-17.*

(Continued)

*Primary Examiner* — Bret P Chen
(74) *Attorney, Agent, or Firm* — Edell, Shapiro & Finnan, LLC

(57) ABSTRACT

According to one aspect of a technique of the present disclosure, there is provided a substrate processing method including: (a) supplying a metal-containing gas to a substrate; (b) supplying a first reducing gas to the substrate; and (c) supplying a second reducing gas different from the first reducing gas to the substrate, wherein a metal-containing film is formed on the substrate by performing (a), (b) and (c) at least once.

18 Claims, 8 Drawing Sheets

(56) References Cited

U.S. PATENT DOCUMENTS

| | | | | |
|---|---|---|---|---|
| 2007/0082130 | A1* | 4/2007 | Shinriki | H01L 21/02063 427/250 |
| 2015/0111378 | A1* | 4/2015 | Ogawa | C23C 16/45525 438/660 |
| 2018/0237911 | A1 | 8/2018 | Narushima et al. | |
| 2018/0265986 | A1* | 9/2018 | Möller | B24C 7/0046 |
| 2018/0294187 | A1 | 10/2018 | Thombare et al. | |
| 2019/0067003 | A1 | 2/2019 | Zope et al. | |
| 2019/0371609 | A1* | 12/2019 | Degai | C23C 16/56 |
| 2020/0194269 | A1 | 6/2020 | Ogawa et al. | |

FOREIGN PATENT DOCUMENTS

| | | | | |
|---|---|---|---|---|
| JP | 2019-527302 | * | 9/2019 | C23C 16/08 |
| JP | 2020-513065 A | | 4/2020 | |
| JP | 2021-120472 | * | 8/2021 | C23C 16/455 |
| KR | 10-2019-0024823 A | | 3/2019 | |
| KR | 10-2020-0033921 A | | 3/2020 | |
| KR | 10-2022-0110343 A | | 8/2022 | |
| KR | 10-2019-0130046 A | | 11/2022 | |
| TW | 201840885 A | | 11/2018 | |
| WO | 2019/058608 A1 | | 3/2019 | |

OTHER PUBLICATIONS

Request for the Submission of an Opinion with English translation in Korean Application No. 10-2023-7008560, issued Oct. 28, 2024, 13 pages.

Notice of Reasons for Refusal with English translation in Japanese Application No. 2022-550292, dated Feb. 29, 2024, 6 pages.

SIPO Office Action with English translation in Chinese Application No. 202080104617.1, dated May 16, 2025, 21 pages.

Letter of Examination Report with English translation in Taiwan Application No. 11120518220, issued May 26, 2022, 9 pages.

Letter of Examination Report with English translation in Taiwan Application No. 110131783, dated Jan. 15, 2024, 33 pages.

Request for the Submission of an Opinion with English translation in Korean Application No. 10-2023-7008560, dated Nov. 3, 2025, 13 pages.

* cited by examiner

FIG. 3

FIG. 7A
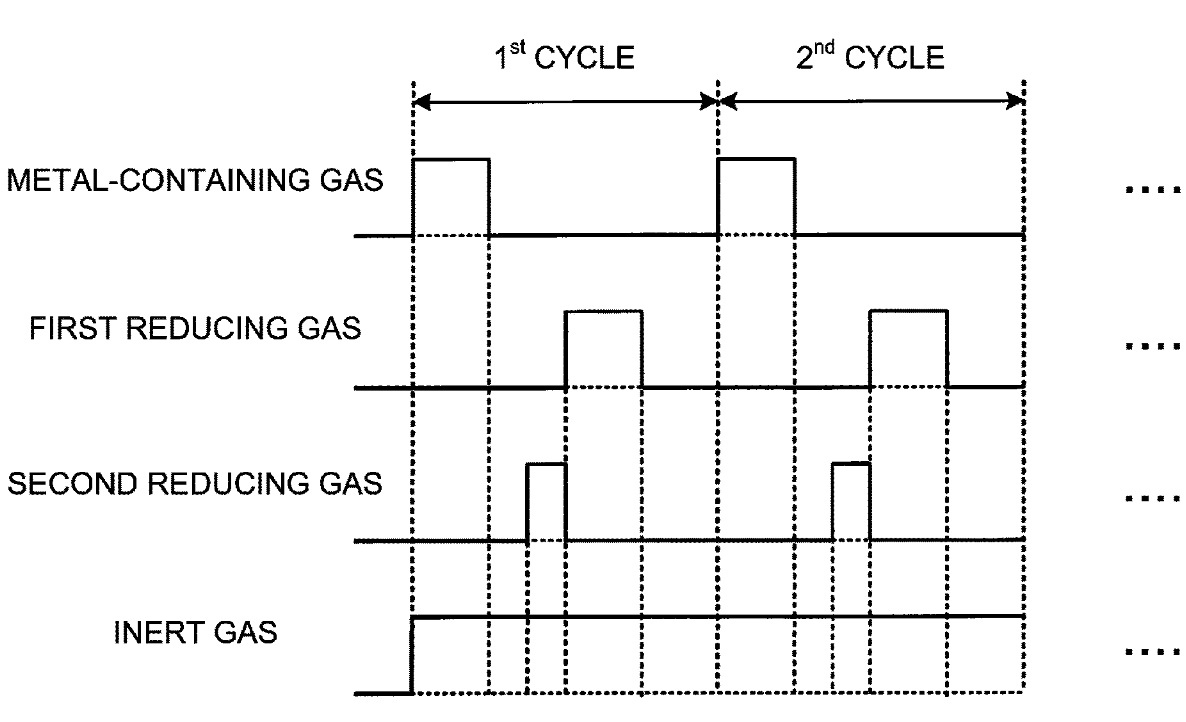
FIG. 7B
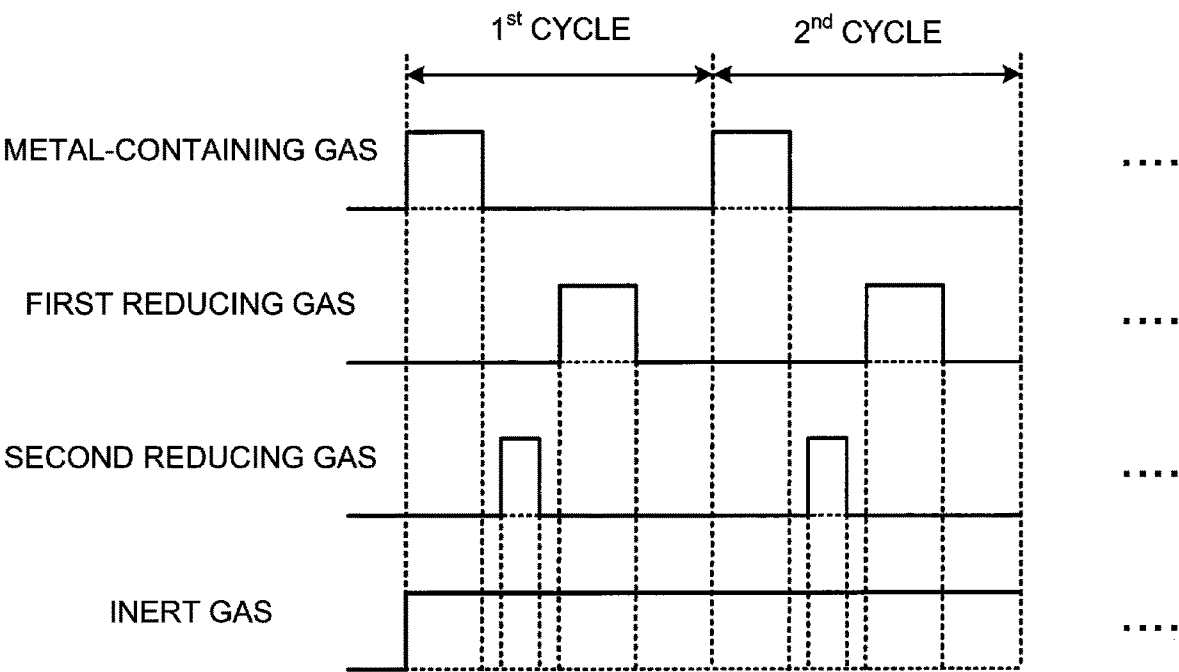

402
407
403w
432a
432b
401
200
432c
417
403
431
455

SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS REFERENCE TO RELATED APPLICATIONS

This application is a bypass continuation application of PCT International Application No. PCT/JP2020/035478, filed on Sep. 18, 2020, in the WIPO, the entire contents of which are hereby incorporated by reference.

TECHNICAL FIELD

The present disclosure relates to a substrate processing method, a method of manufacturing a semiconductor device, a non-transitory computer-readable recording medium and a substrate processing apparatus.

BACKGROUND

For example, a tungsten film (W film) whose resistance is low is used as a word line of a NAND flash memory (or a DRAM) of a three-dimensional structure. For example, according to some related arts, a titanium nitride film (TiN film) serving as a barrier film may be used between the W film and an insulating film.

However, as the number of layers in the NAND flash memory of the three-dimensional structure increases, it may be difficult to etch the layers. Thereby, it becomes difficult to make the word line thinner. In order to address the problem described above, instead of using the TiN film and the W film described above, a molybdenum (Mo) film may be formed and used as the word line. However, in order to form the Mo film whose resistance is low and containing few foreign substances, hydrogen (H2) gas may be supplied at a large flow rate for a long time. As a result, there is a problem that a throughput may decrease.

SUMMARY

According to one aspect of a technique of the present disclosure, there is provided a substrate processing method including: (a) supplying a metal-containing gas to a substrate; (b) supplying a first reducing gas to the substrate; and (c) supplying a second reducing gas different from the first reducing gas to the substrate, wherein a metal-containing film is formed on the substrate by performing (a), (b) and (c) at least once.

BRIEF DESCRIPTION OF THE DRAWINGS

FIG. 3 is a block diagram schematically illustrating a configuration of a controller and related components of the substrate processing apparatus according to the embodiments of the technique of the present disclosure.

FIGS. 7A and 7B are diagrams schematically illustrating a substrate processing according to a third modified example of the embodiments of the technique of the present disclosure.

DETAILED DESCRIPTION

Embodiments of Present Disclosure

Figure 1:
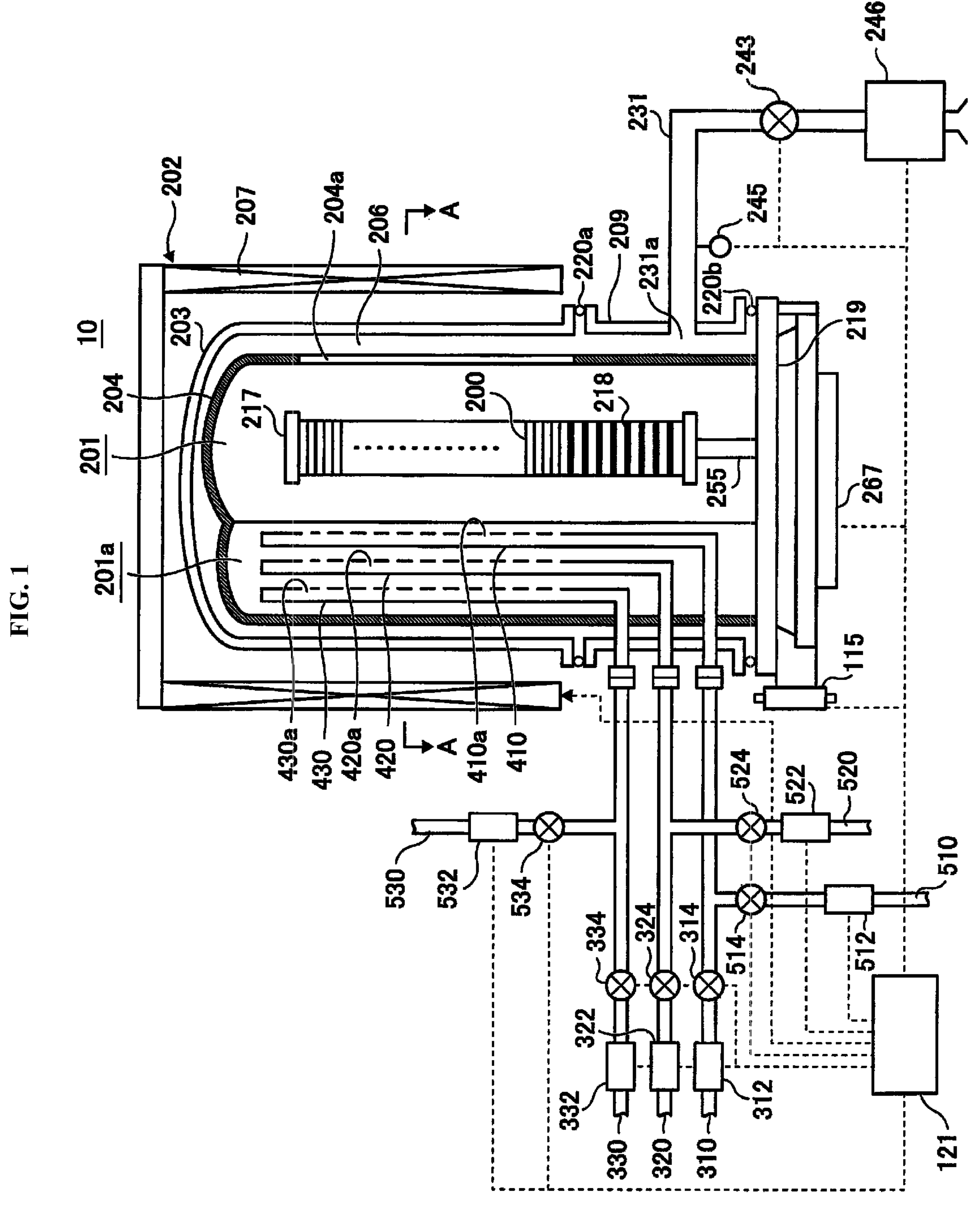
FIG. 1 is a diagram schematically illustrating a vertical cross-section of a vertical type process furnace of a substrate processing apparatus according to one or more embodiments of the technique of the present disclosure.

Hereinafter, one or more embodiments (also simply referred to as "embodiments") according to the technique of the present disclosure will be described with reference to FIGS. 1 through 4. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

A substrate processing apparatus 10 according to the present embodiments includes a process furnace 202 provided with a heater 207 serving as a heating structure (which is a heating device or a heating system). The heater 207 is of a cylindrical shape, and is vertically installed while being supported by a heater base (not shown) serving as a support plate.

An outer tube 203 constituting a reaction tube (which is a reaction vessel or a process vessel) is provided in an inner side of the heater 207 to be aligned in a manner concentric with the heater 207. For example, the outer tube 203 is made of a heat resistant material such as quartz (SiO2) and silicon carbide (SiC). The outer tube 203 is of a cylindrical shape with a closed upper end and an open lower end. A manifold (which is an inlet flange) 209 is provided under the outer tube 203 to be aligned in a manner concentric with the outer tube 203. For example, the manifold 209 is made of a metal such as stainless steel (SUS). The manifold 209 is of a cylindrical shape with open upper and lower ends. An O-ring 220*a* serving as a seal is provided between the upper end of the manifold 209 and the outer tube 203. As the manifold 209 is supported by the heater base (not shown), the outer tube 203 is installed vertically.

An inner tube 204 constituting the reaction vessel is provided in an inner side of the outer tube 203. For example, the inner tube 204 is made of a heat resistant material such as quartz ($SiO2$) and silicon carbide (SiC). The inner tube 204 is of a cylindrical shape with a closed upper end and an open lower end. The process vessel (reaction vessel) is constituted mainly by the outer tube 203, the inner tube 204 and the manifold 209. A process chamber 201 is provided in a hollow cylindrical portion of the process vessel (that is, an inside of the inner tube 204).

The process chamber 201 is configured to be capable of accommodating a plurality of wafers including a wafer 200 serving as a substrate in a horizontal orientation to be vertically arranged in a multistage manner by a boat 217 serving as a substrate support, which will be described later. Hereinafter, the plurality of wafers including the wafer 200 may also be simply referred to as wafers 200.

Nozzles 410, 420 and 430 are installed in the process chamber 201 so as to penetrate a side wall of the manifold 209 and the inner tube 204. Gas supply pipe 310, 320 and 330 are connected to the nozzles 410, 420 and 430, respectively. However, the process furnace 202 of the present embodiments is not limited to the example described above.

Mass flow controllers (MFCs) 312, 322 and 332 serving as flow rate controllers (flow rate control structures) and valves 314, 324 and 334 serving as opening/closing valves are sequentially installed at the gas supply pipes 310, 320 and 330 in this order from upstream sides to downstream sides of the gas supply pipes 310, 320 and 330, respectively. Gas supply pipes 510, 520 and 530 through which an inert gas is supplied are connected to the gas supply pipes 310, 320 and 330 at downstream sides of the valves 314, 324 and 334, respectively. MFCs 512, 522 and 532 serving as flow rate controllers (flow rate control structures) and valves 514, 524 and 534 serving as opening/closing valves are sequentially installed at the gas supply pipes 510, 520 and 530 in this order from upstream sides to downstream sides of the gas supply pipes 510, 520 and 530, respectively.

The nozzles 410, 420 and 430 are connected to front ends (tips) of the gas supply pipes 310, 320 and 330, respectively. Each of the nozzles 410, 420 and 430 may include an L-shaped nozzle. Horizontal portions of the nozzles 410, 420 and 430 are installed so as to penetrate the side wall of the manifold 209 and the inner tube 204. Vertical portions of the nozzles 410, 420 and 430 are installed in a spare chamber 201*a* of a channel shape (a groove shape) protruding outward in a radial direction of the inner tube 204 and extending in the vertical direction. That is, the vertical portions of the nozzles 410, 420 and 430 are installed in the spare chamber 201*a* toward the upper end of the inner tube 204 (in a direction in which the wafers 200 are arranged) and along an inner wall of the inner tube 204.

The nozzles 410, 420 and 430 extend from a lower region of the process chamber 201 to an upper region of the process chamber 201. The nozzles 410, 420 and 430 are provided with a plurality of gas supply holes 410*a*, a plurality of gas supply holes 420*a* and a plurality of gas supply holes 430*a* facing the wafers 200, respectively. Thereby, a gas such as a process gas can be supplied to the wafers 200 through the gas supply holes 410*a* of the nozzle 410, the gas supply holes 420*a* of the nozzle 420 and the gas supply holes 430*a* of the nozzle 430. The gas supply holes 410*a*, the gas supply holes 420*a* and the gas supply holes 430*a* are provided from a lower portion to an upper portion of the inner tube 204. An opening area of each of the gas supply holes 410*a*, the gas supply holes 420*a* and the gas supply holes 430*a* is the same, and each of the gas supply holes 410*a*, the gas supply holes 420*a* and the gas supply holes 430*a* is provided at the same pitch. However, the gas supply holes 410*a*, the gas supply holes 420*a* and the gas supply holes 430*a* are not limited thereto. For example, the opening area of each of the gas supply holes 410*a*, the gas supply holes 420*a* and the gas supply holes 430*a* may gradually increase from the lower portion to the upper portion of the inner tube 204 to further uniformize a flow rate of the gas supplied through the gas supply holes 410*a*, the gas supply holes 420*a* and the gas supply holes 430*a*.

The gas supply holes 410*a* of the nozzle 410, the gas supply holes 420*a* of the nozzle 420 and the gas supply holes 430*a* of the nozzle 430 are provided from a lower portion to an upper portion of the boat 217 described later. Therefore, the process gas supplied into the process chamber 201 through the gas supply holes 410*a*, the gas supply holes 420*a* and the gas supply holes 430*a* is supplied onto the wafers 200 accommodated in the boat 217 from the lower portion to the upper portion thereof, that is, the entirety of the wafers 200 accommodated in the boat 217. It is preferable that the nozzles 410, 420 and 430 extend from the lower region to the upper region of the process chamber 201. However, the nozzles 410, 420 and 430 may extend only to the vicinity of a ceiling of the boat 217.

A source gas containing a metal element (also referred to as a "metal-containing gas") is supplied into the process chamber 201 through the gas supply pipe 310 provided with the MFC 312 and the valve 314 and the nozzle 410. The source gas serves as one of process gases.

A first reducing gas serving as one of the process gases is supplied into the process chamber 201 through the gas supply pipe 320 provided with the MFC 322 and the valve 324 and the nozzle 420.

A second reducing gas serving as one of the process gases and different from the first reducing gas is supplied into the process chamber 201 through the gas supply pipe 330 provided with the MFC 332 and the valve 334 and the nozzle 430.

The inert gas such as nitrogen ($N2$) gas is supplied into the process chamber 201 through the gas supply pipes 510, 520 and 530 provided with the MFCs 512, 522 and 532 and the valves 514, 524 and 534, respectively, and the nozzles 410, 420 and 430. While the present embodiments will be described by way of an example in which the $N2$ gas is used as the inert gas, the inert gas according to the present embodiments is not limited thereto. For example, instead of the $N2$ gas, a rare gas such as argon (Ar) gas, helium (He) gas, neon (Ne) gas and xenon (Xe) gas may be used as the inert gas.

When the source gas is supplied through the gas supply pipe 310, a source gas supplier (which is a source gas supply structure or a source gas supply system) is constituted mainly by the gas supply pipe 310, the MFC 312 and the valve 314. The source gas supplier may further include the nozzle 410. The source gas supplier may also be referred to as a "metal-containing gas supplier" which is a metal-containing gas supply structure or a metal-containing gas supply system. Further, when the first reducing gas is supplied through the gas supply pipe 320, a first reducing gas supplier (which is a first reducing gas supply structure or a first reducing gas supply system) is constituted mainly by the gas supply pipe 320, the MFC 322 and the valve 324. The first reducing gas supplier may further include the nozzle 420. Further, when the second reducing gas is supplied through the gas supply pipe 330, a second reducing gas supplier (which is a second reducing gas supply structure or a second reducing gas supply system) is constituted mainly by the gas supply pipe 330, the MFC 332 and the valve 334. The second reducing gas supplier may further include the nozzle 430. A process gas supplier (which is a process gas supply structure or a process gas supply system) is constituted by the metal-containing gas supplier, the first reducing gas supplier and the second reducing gas supplier. Further, the process gas supplier may further include the nozzles 410, 420 and 430. In addition, an inert gas supplier (which is an inert gas supply structure or an inert gas supply system) is constituted mainly by the gas supply pipes 510, 520 and 530, the MFCs 512, 522 and 532 and the valves 514, 524 and 534.

According to the present embodiments, the gas is supplied into a vertically long annular space which is defined by the inner wall of the inner tube 204 and edges (peripheries) of the wafers 200 through the nozzles 410, 420 and 430 provided in the spare chamber 201*a*. The gas is ejected into the inner tube 204 through the gas supply holes 410*a* of the nozzle 410, the gas supply holes 420*a* of the nozzle 420 and the gas supply holes 430*a* of the nozzle 430 facing the wafers 200. Specifically, gases such as the source gas are ejected into the inner tube 204 in a direction parallel to surfaces of the wafers 200 through the gas supply holes 410*a* of the nozzle 410, the gas supply holes 420*a* of the nozzle 420 and the gas supply holes 430*a* of the nozzle 430, respectively.

An exhaust hole (which is an exhaust port) 204*a* is a through-hole facing the nozzles 410, 420 and 430, and is provided at a side wall of the inner tube 204. For example, the exhaust hole 204*a* may be of a narrow slit-shaped through-hole elongating vertically. The gas supplied into the process chamber 201 through the gas supply holes 410*a* of the nozzle 410, the gas supply holes 420*a* of the nozzle 420 and the gas supply holes 430*a* of the nozzle 430 flows over the surfaces of the wafers 200. The gas that has flowed over the surfaces of the wafers 200 is exhausted through the exhaust hole 204*a* into a gap (that is, an exhaust path 206) provided between the inner tube 204 and the outer tube 203. The gas flowing in the exhaust path 206 flows into an exhaust pipe 231 and is then discharged (exhausted) out of the process furnace 202.

The exhaust hole 204*a* is provided to face the wafers 200. The gas supplied in the vicinity of the wafers 200 in the process chamber 201 through the gas supply holes 410*a*, the gas supply holes 420*a* and the gas supply holes 430*a* flows in the horizontal direction. The gas that has flowed in the horizontal direction is exhausted through the exhaust hole 204*a* into the exhaust path 206. The exhaust hole 204*a* is not limited to the slit-shaped through-hole. For example, the exhaust hole 204*a* may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially installed at the exhaust pipe 231 in this order from an upstream side to a downstream side of the exhaust pipe 231. With the vacuum pump 246 in operation, the APC valve 243 may be opened or closed to perform a vacuum exhaust of the process chamber 201 or stop the vacuum exhaust. Further, with the vacuum pump 246 in operation, an opening degree of the APC valve 243 may be adjusted in order to adjust the inner pressure of the process chamber 201. An exhauster (which is an exhaust structure or an exhaust system) is constituted mainly by the exhaust hole 204*a*, the exhaust path 206, the exhaust pipe 231, the APC valve 243 and the pressure sensor 245. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. For example, the seal cap 219 is made of a metal such as SUS, and is of a disk shape. An O-ring 220*b* serving as a seal is provided on an upper surface of the seal cap 219 so as to be in contact with the lower end of the manifold 209. A rotator 267 configured to rotate the boat 217 accommodating the wafers 200 is provided at the seal cap 219 in a manner opposite to the process chamber 201. A rotating shaft 255 of the rotator 267 is connected to the boat 217 through the seal cap 219. As the rotator 267 rotates the boat 217, the wafers 200 are rotated. The seal cap 219 may be elevated or lowered in the vertical direction by a boat elevator 115 serving as an elevating structure vertically provided outside the outer tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 is configured to accommodate (or support) the wafers 200 (for example, 25 to 200 wafers) while the wafers 200 are horizontally oriented with their centers aligned with one another with a predetermined interval therebetween in a multistage manner. For example, the boat 217 is made of a heat resistant material such as quartz and SiC. A plurality of dummy substrates 218 horizontally oriented are provided under the boat 217 in a multistage manner. Each of the dummy substrates 218 is made of a heat resistant material such as quartz and SiC. With such a configuration, the dummy substrates 218 suppress the transmission of the heat from the heater 207 to the seal cap 219. However, the present embodiments are not limited thereto. For example, instead of the dummy substrates 218, a heat insulating cylinder (not shown) such as a cylinder made of a heat resistant material such as quartz and SiC may be provided under the boat 217.

Figure 2:
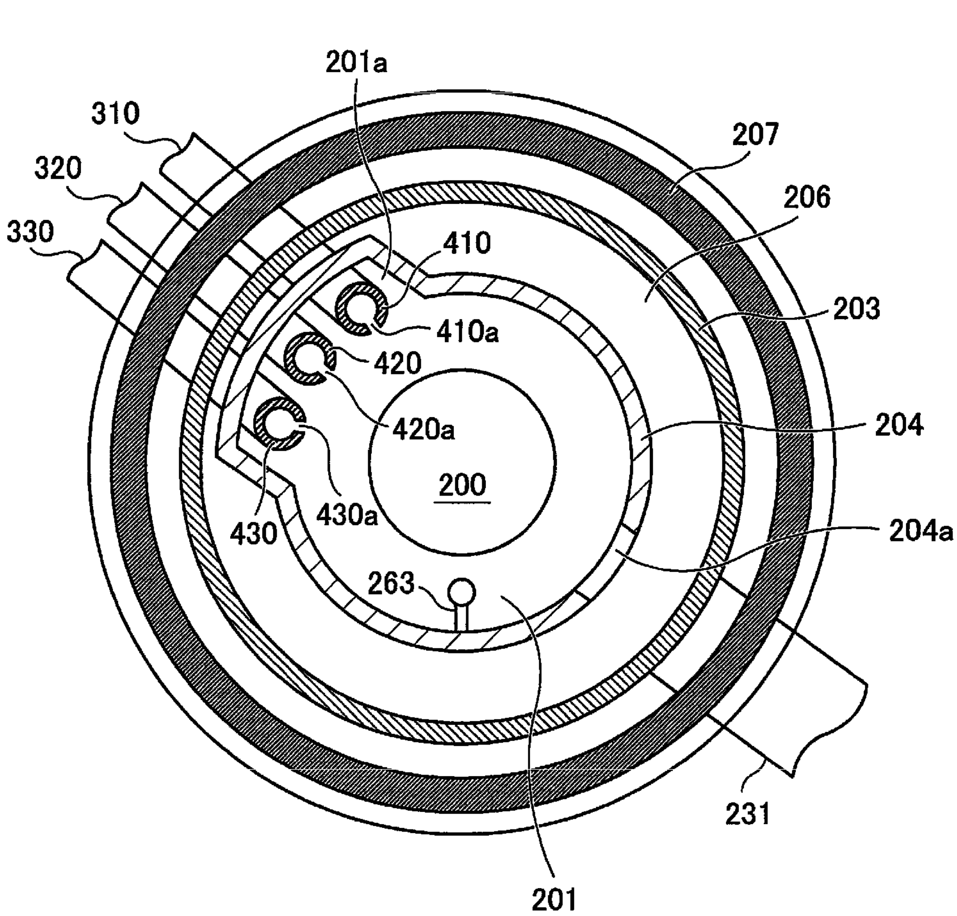
FIG. 2 is a diagram schematically illustrating a horizontal cross-section taken along a line A-A (in FIG. 1) of the vertical type process furnace of the substrate processing apparatus according to the embodiments of the technique of the present disclosure.

As shown in FIG. 2, a temperature sensor 263 serving as a temperature detector is installed in the inner tube 204. An amount of the current supplied (or applied) to the heater 207 is adjusted based on temperature information detected by the temperature sensor 263 such that a desired temperature distribution of an inner temperature of the process chamber 201 can be obtained. Similar to the nozzles 410, 420 and 430, the temperature sensor 263 is L-shaped, and is provided along the inner wall of the inner tube 204.

Figure 3:
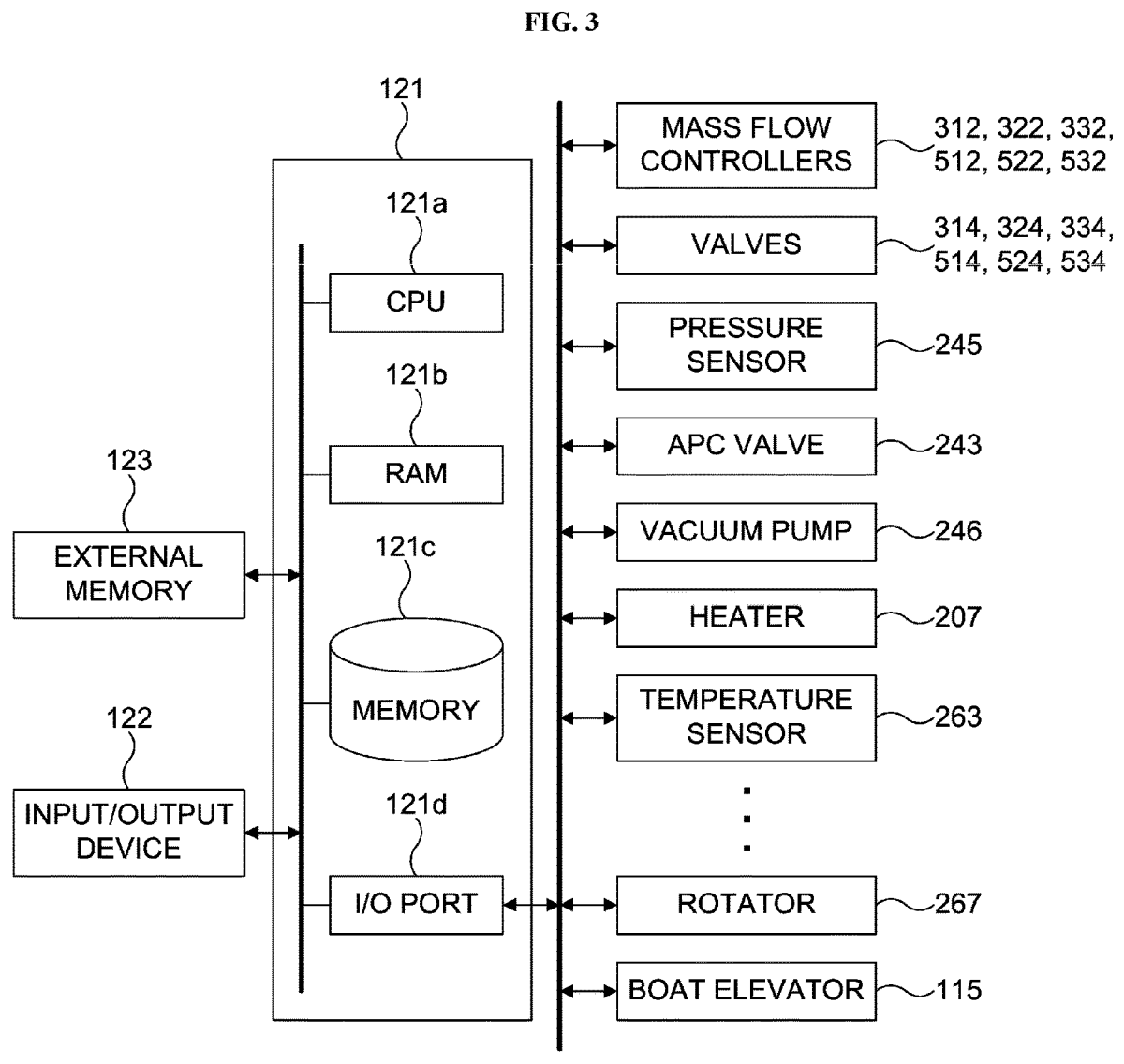

As shown in FIG. 3, a controller 121 serving as a control device (or a control structure) is constituted by a computer including a CPU (Central Processing Unit) 121*a*, a RAM (Random Access Memory) 121*b*, a memory 121*c* and an I/O port 121*d*. The RAM 121*b*, the memory 121*c* and the I/O port 121*d* may exchange data with the CPU 121*a* through an internal bus (not shown). For example, an input/output device 122 constituted by a component such as a touch panel is connected to the controller 121.

The memory 121*c* is configured by a component such as a flash memory and a hard disk drive (HDD). For example, a control program configured to control an operation of the substrate processing apparatus 10 or a process recipe containing information on sequences and conditions of a method of manufacturing a semiconductor device described later is readably stored in the memory 121c. The process recipe is obtained by combining steps of the method of manufacturing the semiconductor device described later such that the controller 121 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 121b functions as a memory area (work area) where a program or data read by the CPU 121a is temporarily stored.

The I/O port 121d is connected to the components described above such as the MFCs 312, 322, 332, 512, 522 and 532, the valves 314, 324, 334, 514, 524 and 534, the pressure sensor 245, the APC valve 243, the vacuum pump 246, the heater 207, the temperature sensor 263, the rotator 267 and the boat elevator 115.

The CPU 121a is configured to read the control program from the memory 121c and execute the read control program. In addition, the CPU 121a is configured to read a recipe such as the process recipe from the memory 121c in accordance with an operation command inputted from the input/output device 122. In accordance with the contents of the read recipe, the CPU 121a may be configured to control various operations such as flow rate adjusting operations for various gases by the MFCs 312, 322, 332, 512, 522 and 532, opening and closing operations of the valves 314, 324, 334, 514, 524 and 534, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting a rotation and a rotation speed of the boat 217 by the rotator 267, an elevating and lowering operation of the boat 217 by the boat elevator 115 and an operation of transferring and accommodating the wafer 200 into the boat 217.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as a "recording medium". In the present specification, the term "recording medium" may refer to the memory 121c alone, may refer to the external memory 123 alone, and may refer to both of the memory 121c and the external memory 123. Instead of the external memory 123, a communication structure such as the Internet and a dedicated line may be used for providing the program to the computer.

(2) Substrate Processing

Figure 4:
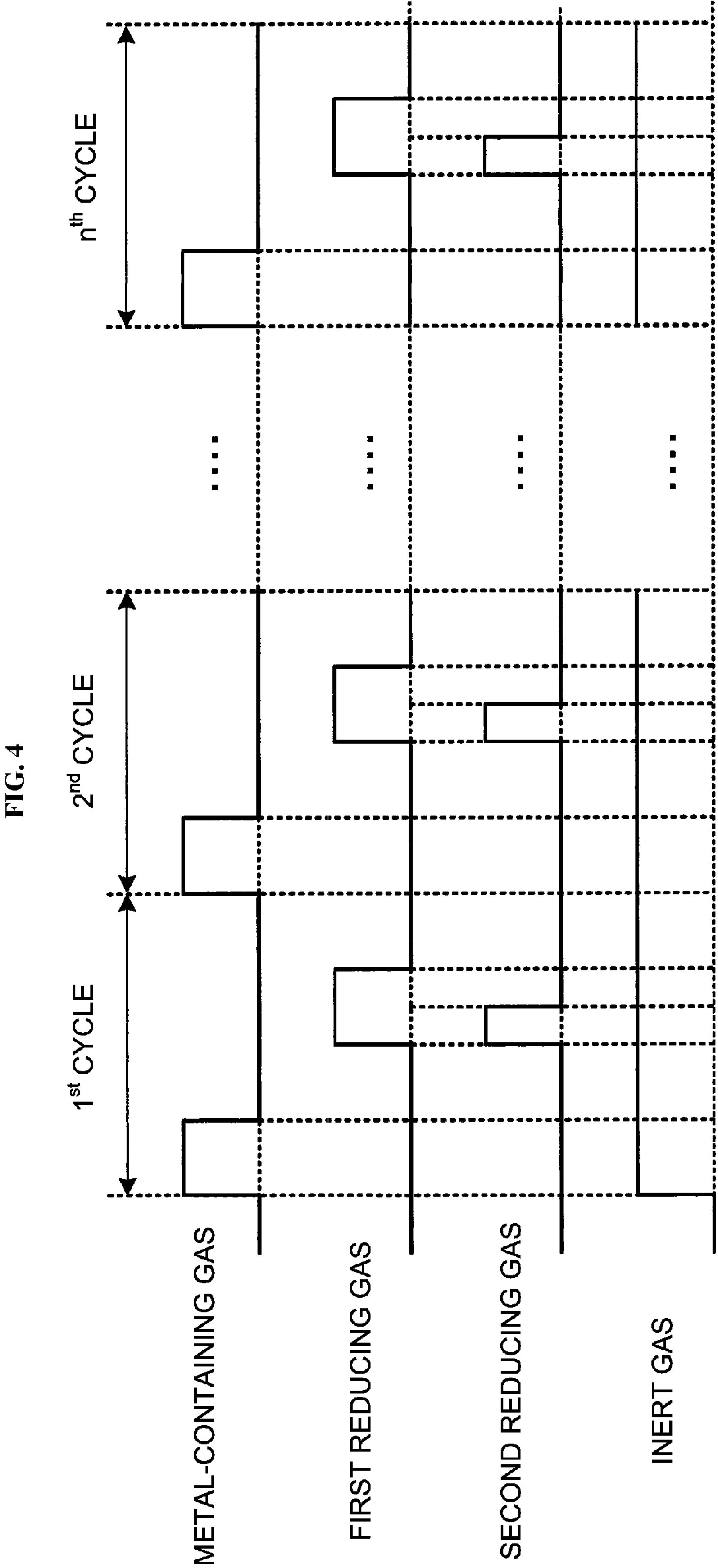
FIG. 4 is a diagram schematically illustrating a substrate processing according to the embodiments of the technique of the present disclosure.

Hereinafter, as a part of a manufacturing process of a semiconductor device, an exemplary substrate processing of forming a film containing molybdenum (Mo) (hereinafter, also referred to as a "molybdenum-containing film" (or a "Mo-containing film") on the wafer 200 will be described with reference to FIG. 4. For example, the Mo-containing film is used as a control gate electrode of a NAND flash memory of a three-dimensional structure. The substrate processing of forming the Mo-containing film is performed by using the process furnace 202 of the substrate processing apparatus 10 described above. In the following description, operations of the components constituting the substrate processing apparatus 10 are controlled by the controller 121.

The substrate processing (that is, the manufacturing process of the semiconductor device) according to the present embodiments may include: (a) accommodating the wafer 200 in the process chamber 201 provided in the process vessel; (b) supplying a metal-containing gas to the wafer 200; (c) supplying a first reducing gas to the wafer 200; and (d) supplying a second reducing gas to the wafer 200. By performing (b), (c) and (d) one or more times, it is possible to form the Mo-containing film serving as a metal-containing film on the wafer 200.

In the present specification, the term "wafer" may refer to "a wafer itself", may refer to "a wafer and a stacked structure (aggregated structure) of a predetermined layer (or layers) or a film (or films) formed on a surface of the wafer". In the present specification, the term "a surface of a wafer" may refer to "a surface of a wafer itself', may refer to "a surface of a predetermined layer or a film formed on a wafer". In the present specification, the term "substrate" and "wafer" may be used as substantially the same meaning.

<Wafer Charging Step and Boat Loading Step>

The wafers 200 are charged (transferred) into the boat 217 (wafer charging step). After the boat 217 is charged with the wafers 200, as shown in FIG. 1, the boat 217 charged with the wafers 200 is elevated by the boat elevator 115 and loaded (transferred) into the process chamber 201 to be accommodated therein (boat loading step). With the boat 217 loaded, the seal cap 219 seals the lower end opening of the manifold 209 via the O-ring 220b.

<Pressure Adjusting Step and Temperature Adjusting Step>

The vacuum pump 246 vacuum-exhausts the inner atmosphere of the process chamber 201 such that the inner pressure of the process chamber 201 (that is, a pressure in a space in which the wafers 200 are accommodated) reaches and is maintained at a desired pressure (vacuum degree). Meanwhile, the inner pressure of the process chamber 201 is measured by the pressure sensor 245, and the APC valve 243 is feedback-controlled based on measured pressure information (pressure adjusting step). The vacuum pump 246 continuously vacuum-exhausts the inner atmosphere of the process chamber 201 until at least a processing of the wafer 200 is completed. The heater 207 heats the process chamber 201 such that the inner temperature of the process chamber 201 reaches and is maintained at a desired temperature. Meanwhile, the amount of the current supplied to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the processing of the wafer 200 is completed.

<First Step (Metal-containing Gas Supply Step)>

The valve 314 is opened to supply the metal-containing gas (serving as the source gas) into the gas supply pipe 310. A flow rate of the metal-containing gas supplied into the gas supply pipe 310 is adjusted by the MFC 312. The metal-containing gas whose flow rate is adjusted is then supplied into the process chamber 201 through the gas supply holes 410a of the nozzle 410, and is exhausted through the exhaust pipe 231. Thereby, the metal-containing gas is supplied to the wafers 200. In the first step, in parallel with a supply of the metal-containing gas, the valve 514 is opened to supply the inert gas such as the N2 gas into the gas supply pipe 510.

A flow rate of the inert gas supplied into the gas supply pipe 510 is adjusted by the MFC 512. The inert gas whose flow rate is adjusted is then supplied into the process chamber 201 together with the metal-containing gas, and is exhausted through the exhaust pipe 231. In the first step, in order to prevent the metal-containing gas from entering the nozzles 420 and 430, the valves 524 and 534 may be opened to supply the inert gas into the gas supply pipes 520 and 530. The inert gas is then supplied into the process chamber 201 through the gas supply pipes 320 and 330 and nozzles 420 and 430, and is exhausted through the exhaust pipe 231.

In the first step, for example, the APC valve 243 is appropriately adjusted (or controlled) such that the inner pressure of the process chamber 201 can be set to a pressure within a range from 1 Pa to 3,990 Pa. For example, the inner pressure of the process chamber 201 is set to 1,000 Pa by adjusting the APC valve 243. For example, a supply flow rate of the metal-containing gas controlled by the MFC 312 can be set to a flow rate within a range from 0.1 slm to 1.0 slm, preferably from 0.3 slm to 0.9 slm. For example, each supply flow rate of the inert gas controlled by each of the MFCs 512, 522 and 532 can be set to a flow rate within a range from 0.1 slm to 20 slm. In the first step, for example, a temperature of the heater 207 can be set such that a temperature of the wafer 200 reaches and is maintained at a temperature within a range from 300° C. to 650° C. In the present specification, a notation of a numerical range such as "from 1 Pa to 3,990 Pa" means that a lower limit and an upper limit are included in the numerical range. Therefore, for example, the numerical range "from 1 Pa to 3,990 Pa" means a range equal to or higher than 1 Pa and equal to or lower than 3,990 Pa. The same also applies to other numerical ranges described herein.

In the first step, the metal-containing gas and the inert gas are supplied into the process chamber 201 without supplying other gases thereto. According to the present embodiments, for example, a gas containing molybdenum (Mo) as the metal element (hereinafter, also referred to as a molybdenum-containing gas" (or a "Mo-containing gas") may be used as the metal-containing gas. For example, a gas containing molybdenum (Mo), oxygen (O) and chlorine (Cl) such as molybdenum dichloride dioxide (MoO2Cl2) gas and molybdenum oxide tetrachloride (MoOCl4) gas may be used as the Mo-containing gas. By supplying the Mo-containing gas, a molybdenum-containing layer (also referred to as a "Mo-containing layer") is formed on the wafer 200 (that is, on a base film on the surface of the wafer 200). The Mo-containing layer may refer to a molybdenum layer containing chlorine (Cl) or oxygen (O), may refer to an adsorption layer of MoO2Cl2 (or MoOCl4), or may refer to both of the molybdenum layer containing chlorine (Cl) or oxygen (O) and the adsorption layer of MoO2Cl2 (or MoOCl4).

<Second Step (Residual Gas Removing Step)>

After a predetermined time (for example, from 1 second to 60 seconds) has elapsed from the supply of the metal-containing gas, the valve 314 of the gas supply pipe 310 is closed to stop the supply of the metal-containing gas. That is, for example, a supply time (which is a time duration or a process time) of supplying the metal-containing gas to the wafer 200 is set to a time within a range from 1 second to 60 seconds. In the second step, with the APC valve 243 of the exhaust pipe 231 open, the vacuum pump 246 vacuum-exhausts the inner atmosphere of the process chamber 201 to remove a residual gas in the process chamber 201 such as a residual metal-containing gas which did not react or which contributed to a formation of the Mo-containing layer (which serves as a metal-containing layer) from the process chamber 201. That is, the process chamber 201 is purged. In the second step, by maintaining the valves 514, 524 and 534 open, the inert gas is continuously supplied into the process chamber 201. The inert gas serves as a purge gas, which improves an efficiency of removing the residual gas in the process chamber 201 such as the residual metal-containing gas which did not react or which contributed to the formation of the metal-containing layer out of the process chamber 201.

<Third Step (Step of Simultaneously Supplying First Reducing Gas and Second Reducing Gas)>

After the residual gas in the process chamber 201 is removed by performing the second step, the valves 324 and 334 are simultaneously opened to supply the first reducing gas into the gas supply pipe 320 and the second reducing gas into the gas supply pipe 330. A flow rate of the first reducing gas supplied into the gas supply pipe 320 is adjusted by the MFC 322. The first reducing gas whose flow rate is adjusted is then supplied into the process chamber 201 through the gas supply holes **420*a* of the nozzle 420, and is exhausted through the exhaust pipe 231. A flow rate of the second reducing gas supplied into the gas supply pipe 330 is adjusted by the MFC 332. The second reducing gas whose flow rate is adjusted is then supplied into the process chamber 201 through the gas supply holes 430*a* of the nozzle 430, and is exhausted through the exhaust pipe 231. Thereby, in the third step, the first reducing gas and the second reducing gas are simultaneously supplied to the wafer 200. In the third step, by maintaining the valves 514, 524 and 534 open, the inert gas is continuously supplied into the gas supply pipes 510, 520 and 530. A flow rate of the inert gas supplied into each of the gas supply pipes 510, 520 and 530 is adjusted by each of the MFCs 512, 522 and 532. The inert gas supplied through the gas supply pipe 520 is supplied into the process chamber 201 together with the first reducing gas through the gas supply pipe 320 and the nozzle 420, and is exhausted through the exhaust pipe 231. Further, the inert gas supplied through the gas supply pipe 530 is supplied into the process chamber 201 together with the second reducing gas through the gas supply pipe 330 and the nozzle 430, and is exhausted through the exhaust pipe 231. Further, the inert gas supplied through the gas supply pipe 510 is supplied into the process chamber 201 through the gas supply pipe 310 and the nozzle 410, and is exhausted through the exhaust pipe 231. In order to prevent the first reducing gas and the second reducing gas from entering the nozzle 410, the inert gas is supplied through the gas supply pipe 510**.

In the third step, for example, the APC valve 243 is appropriately adjusted (or controlled) such that the inner pressure of the process chamber 201 can be set to a pressure within a range from 1 Pa to 13,300 Pa. For example, the inner pressure of the process chamber 201 is set to 10,000 Pa by adjusting the APC valve 243. For example, a supply flow rate of the first reducing gas controlled by the MFC 322 can be set to a flow rate within a range from 1 slm to 50 slm, preferably from 15 slm to 30 slm. For example, a supply flow rate of the second reducing gas controlled by the MFC 332 can be set to a flow rate within a range from 0.1 slm to 1.0 slm, preferably from 0.1 slm to 0.5 slm. For example, each supply flow rate of the inert gas controlled by each of the MFCs 512, 522 and 532 can be set to a flow rate within a range from 0.1 slm to 30 slm. In the third step, for example, the temperature of the heater 207 can be set such that the temperature of the wafer 200 reaches and is maintained at a temperature within a range from 300° C. to 650° C.

In the third step, the first reducing gas, the second reducing gas and the inert gas are supplied to the process chamber 201 without supplying other gases thereto. That is, the first reducing gas and the second reducing gas are simultaneously supplied to the wafer 200. In other words, in the third step, there is a timing at which the first reducing gas and the second reducing gas are simultaneously supplied.

In the third step, for example, a gas constituted by hydrogen (H) such as hydrogen (H2) gas and deuterium (D2) gas may be used as the first reducing gas. Further, for example, a gas containing hydrogen (H) and other elements such as phosphine (PH3) gas may be used as the second reducing gas. A gas whose reducing action is stronger than that of the first reducing gas can be used as the second reducing gas. Further, a gas of a compound whose negative value of a standard Gibbs energy of formation is greater than that of the first reducing gas can be used as the second reducing gas. Hereinafter, the present embodiments will be described by way of an example in which the H2 gas is used as the first reducing gas and the PH3 gas is used as the second reducing gas. By simultaneously supplying two different reducing gases (that is, the H2 gas and the PH3 gas) to the wafer 200, oxygen (O) and chlorine (CI) contained in the Mo-containing layer such as molybdenum layer (which serves as the metal-containing layer formed on the wafer 200) or the adsorption layer of MoO2Cl2 react with H2 and PH3, and oxygen (O) and chlorine (Cl) are reduced and removed from the Mo-containing layer such as molybdenum layer or the adsorption layer of MoO2Cl2. As a result, a substance such as water vapor (H2O), hydrogen chloride (HCl), chlorine (Cl2) and polonium tetrachloride (POCl4) is discharged (or exhausted) from the process chamber 201 as reaction by-products.

In the third step, a chemical reaction between the MoO2Cl2 gas and the PH3 gas is likely to occur. In other words, the larger the negative value of the standard Gibbs energy of formation, the more likely the chemical reaction will occur and the more easily a gas such as the POCl4 will be generated. The POCl4 is easily desorbed from and hardly adsorbed on a film such as the Mo-containing layer. That is, by supplying the PH3 gas, it is possible to generate the POCl4 serving as the reaction by-products, which is easily desorbed from but hardly adsorbed on the film.

That is, by reacting oxygen (O) and chlorine (CI) contained in the Mo-containing layer (such as molybdenum layer or the adsorption layer of MoO2Cl2) with H2 and PH3, a MoCl termination is formed on the wafer 200, and the reaction by-products such as the H2O, the HCl and the POCl4 can be discharged (or exhausted) from the process chamber 201. Thereby, a Mo-containing layer containing molybdenum (Mo) and substantially free of chlorine (Cl) and oxygen (O) is formed on the wafer 200.

<Fourth Step (First Reducing Gas Supply Step)>

After a predetermined time (for example, from 1 second to 1,200 seconds) has elapsed from a simultaneous supply of the first reducing gas and the second reducing gas, the valve 334 of the gas supply pipe 330 is closed to stop a supply of the second reducing gas. That is, for example, a supply time of simultaneously supplying the first reducing gas and the second reducing gas to the wafer 200 is set to a time within a range from 1 second to 1,200 seconds. In the fourth step, by maintaining the valves 514, 524 and 534 open, the inert gas is continuously supplied into the gas supply pipes 510, 520 and 530. The flow rate of the inert gas supplied into each of the gas supply pipes 510, 520 and 530 in the fourth step is adjusted by each of the MFCs 512, 522 and 532. The inert gas supplied through the gas supply pipe 520 is supplied into the process chamber 201 together with the first reducing gas through the gas supply pipe 320 and the nozzle 420, and is exhausted through the exhaust pipe 231. Further, the inert gas supplied through each of the gas supply pipes 510 and 530 is supplied into the process chamber 201 through each of the gas supply pipes 310 and 330 and each of the nozzles 410 and 430, and is exhausted through the exhaust pipe 231. In order to prevent the first reducing gas from entering the nozzles 410 and 430, the inert gas is supplied through each of the gas supply pipes 510 and 530.

In the fourth step, the first reducing gas and the inert gas are supplied to the process chamber 201 without supplying other gases thereto. That is, the first reducing gas and the inert gas are supplied to the wafer 200.

<Fifth Step (Residual Gas Removing Step)>

After a predetermined time (for example, from 1 second to 1,200 seconds) has elapsed from a supply of the first reducing gas, the valve 324 of the gas supply pipe 320 is closed to stop the supply of the first reducing gas. Then, a residual gas in the process chamber 201 such as a residual first reducing gas which did not react or which contributed to a formation of the metal-containing layer and reaction by-products are removed out of the process chamber 201 in substantially the same manners as in the second step. That is, the process chamber 201 is purged.

That is, the supply of the first reducing gas and the supply of the second reducing gas are started simultaneously. Then, after the supply of the second reducing gas is stopped, the supply of the first reducing gas is stopped.

In other words, the supply of the first reducing gas and the supply of the second reducing gas are performed partially in parallel, and a supply time (which is a time duration or a process time) of supplying the second reducing gas to the wafer 200 is set to be shorter than a supply time (which is a time duration or a process time) of supplying the first reducing gas to the wafer 200. In other words, the supply time of supplying the first reducing gas to the wafer 200 is set to be longer than the supply time of supplying the second reducing gas to the wafer 200.

According to the example in which the PH3 gas is used as the second reducing gas, when a supply time of the PH3 gas is lengthened, an amount of the POCl4 serving as the reaction by-products increases. As a result, phosphorus (P) content in the Mo-containing layer increases. Therefore, a supply time of the H2 gas is set to be longer than the supply time of the PH3 gas. As a result, by removing the POCl4 serving as the reaction by-products, it is possible to prevent (or suppress) the POCl4 from remaining in the Mo-containing layer. Therefore, it is possible to reduce the phosphorus (P) content in the Mo-containing layer.

<Performing a Predetermined Number of Times>

By performing a cycle (in which the first step through the fifth step described above are sequentially performed in this order) at least once (that is, a predetermined number of times (n times)), the metal-containing film of a predetermined thickness is formed on the wafer 200. It is preferable that the cycle described above is repeatedly performed a plurality number of times. In the present embodiments, when the metal-containing gas is the Mo-containing gas, the Mo-containing film serving as the metal-containing film is formed. Further, the Mo-containing film refers to a film containing molybdenum as a main component.

<After-purge Step and Returning to Atmospheric Pressure Step>

The inert gas is supplied into the process chamber 201 through each of the gas supply pipes 510, 520 and 530, and is exhausted through the exhaust pipe 231. The inert gas serves as the purge gas, and the inner atmosphere of the process chamber 201 is purged with the inert gas. Thus, the residual gas in the process chamber 201 or the reaction by-products remaining in the process chamber 201 is removed from the process chamber 201 (after-purge step). Thereafter, the inner atmosphere of the process chamber 201 is replaced with the inert gas (substitution by inert gas), and the inner pressure of the process chamber 201 is returned to a normal pressure (atmospheric pressure) (returning to atmospheric pressure step).

<Boat Unloading and Wafer Discharging Step>

Thereafter, the seal cap 219 is lowered by the boat elevator 115 and the lower end opening of the manifold 209 is opened. The boat 217 with the processed wafers 200 charged therein is unloaded out of the outer tube 203 through the lower end opening of the manifold 209 (boat unloading step). Then, the processed wafers 200 are discharged (transferred) out of the boat 217 (wafer discharging step).

(3) Effects according to Present Embodiments

According to the present embodiments, it is possible to obtain one or more of the following effects.

(a) It is possible to improve electrical properties of the Mo-containing film.
(b) It is possible to form the Mo-containing film whose resistance is low and containing few foreign substances such as by-products.
(c) It is possible to improve the productivity (throughput).

(4) Modified Examples

Subsequently, modified examples of the substrate processing in the embodiments described above will be described in detail. In the description of the modified examples below, supply timings of the first reducing gas and the second reducing gas are different from those of the embodiments described above. In the description of the modified examples below, features different from those of the embodiments described above will be exclusively described in detail.

First Modified Example

Figure 5:
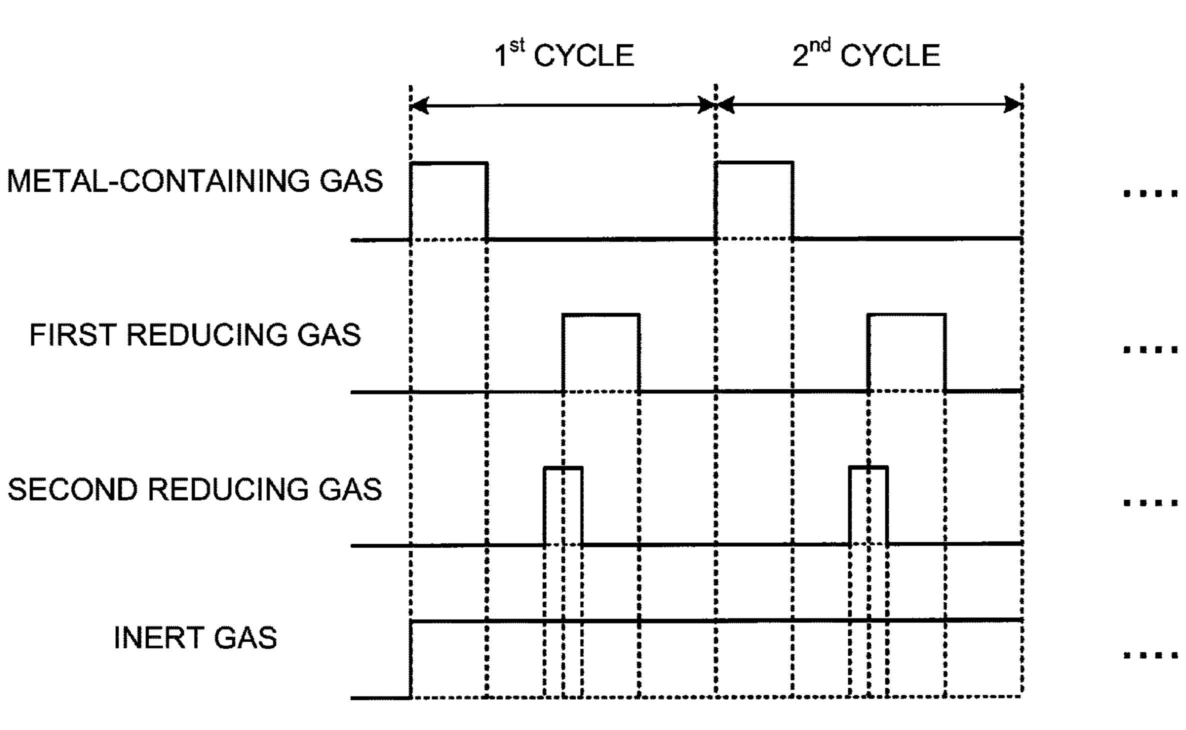
FIG. 5 is a diagram schematically illustrating a substrate processing according to a first modified example of the embodiments of the technique of the present disclosure.

According to the present modified example, as shown in FIG. 5, after the first step of supplying the metal-containing gas described above and the second step of removing the residual gas described above, a third step of supplying the second reducing gas of the present modified example is started. Further, after a predetermined time (for example, from 1 second to 20 seconds) has elapsed from the supply of the second reducing gas in the third step of the present modified example, the supply of the first reducing gas is started as a fourth step of the present modified example. In addition, after a predetermined time (for example, from 1 second to 20 seconds) has elapsed from the simultaneous supply of the first reducing gas and the second reducing gas of the present modified example, the supply of the second reducing gas is stopped and after a predetermined time (for example, from 1 second to 120 seconds) has elapsed from a stop of the supply of the second reducing gas, the supply of the first reducing gas is stopped, which serve as a fifth step of the present modified example. Then, the residual gas is removed as a sixth step of the present modified example. By performing a cycle (in which the first step through the sixth step of the present modified example are sequentially performed in this order) at least once (that is, a predetermined number of times (n times)), the metal-containing film of a predetermined thickness is formed on the wafer 200. According to the present modified example, similar to the embodiments described above, the supply time of supplying the second reducing gas to the wafer 200 is set to be shorter than the supply time of supplying the first reducing gas to the wafer 200.

That is, according to the present modified example, the supply of the first reducing gas is started after the supply of the second reducing gas is started, the supply of the first reducing gas and the supply of the second reducing gas are performed partially in parallel, and the supply of the first reducing gas is stopped after the supply of the second reducing gas is stopped. By supplying the second reducing gas before the first reducing gas according to the present modified example, it is possible to remove elements other than a metal element from the metal-containing layer containing the elements other than the metal element contained in the metal-containing gas or from an adsorption layer of molecules of the metal-containing gas. By removing the elements other than the metal element, it is possible to form a film which is easily reduced by the first reducing gas. In other words, since the second reducing gas that is not diluted with the first reducing gas is supplied, it is possible to improve a probability of contact between the adsorption layer of the molecules of the metal-containing gas and molecules of the second reducing gas. Thereby, it is possible to form the film which is easily reduced by the first reducing gas. Further, by stopping the supply of the first reducing gas after stopping the supply of the second reducing gas, it is possible to prevent (or suppress) the reaction by-products from remaining in the film. Even in such a case, it is possible to obtain substantially the same effects as those of the embodiments described with reference to FIG. 4. According to the present modified example, when the MoO2Cl2 gas is used as the metal-containing gas, oxygen (O) and chlorine (Cl) are removed from the adsorption layer of MoO2Cl2 or the Mo-containing layer containing chlorine (Cl) or oxygen (O). Thereby, it is possible to form the film which is easily reduced by the first reducing gas.

Second Modified Example

Figure 6:
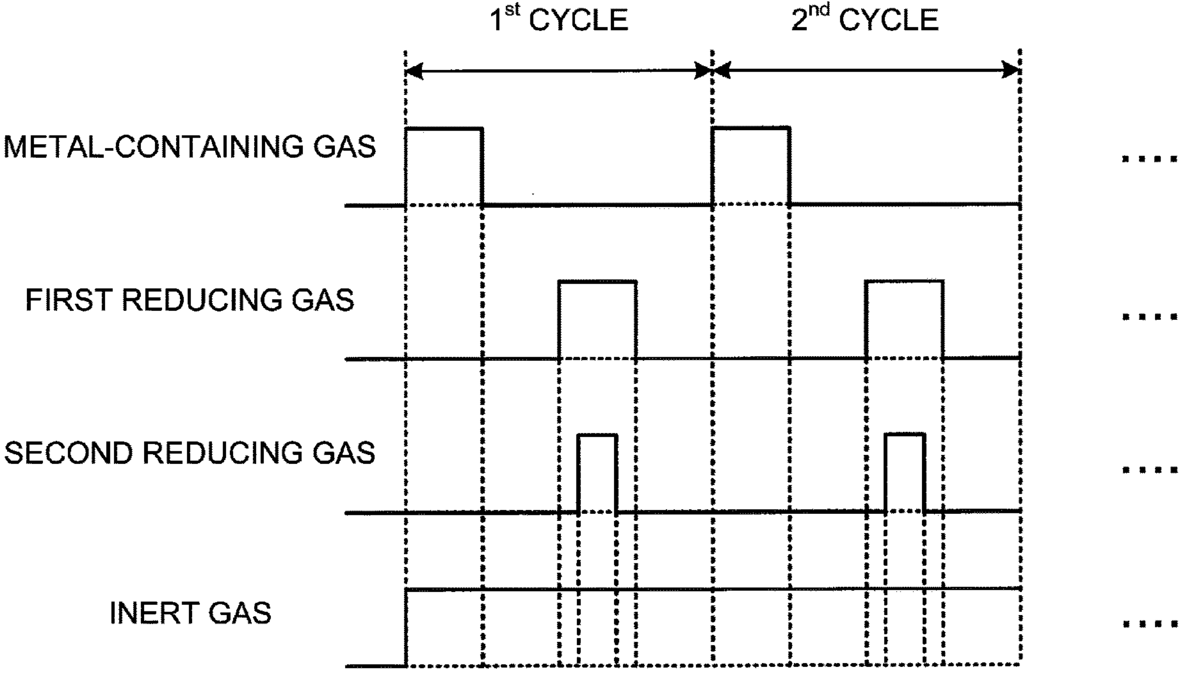
FIG. 6 is a diagram schematically illustrating a substrate processing according to a second modified example of the embodiments of the technique of the present disclosure.

According to the present modified example, as shown in FIG. 6, after the first step of supplying the metal-containing gas described above and the second step of removing the residual gas described above, a third step of supplying the first reducing gas of the present modified example is started. Further, after a predetermined time (for example, from 1 second to 60 seconds) has elapsed from the supply of the first reducing gas in the third step of the present modified example, the supply of the second reducing gas is started as a fourth step of the present modified example. In addition, after a predetermined time (for example, from 1 second to 60 seconds) has elapsed from the simultaneous supply of the first reducing gas and the second reducing gas of the present modified example, the supply of the second reducing gas is stopped and after a predetermined time (for example, from 1 second to 60 seconds) has elapsed from a stop of the supply of the second reducing gas, the supply of the first reducing gas is stopped, which serve as a fifth step of the present modified example. That is, the second reducing gas is supplied while the first reducing gas is being supplied. In other words, the supply of the second reducing gas is started after the supply of the first reducing gas is started, and the supply of the first reducing gas is stopped after the supply of the second reducing gas is stopped. Then, the residual gas is removed as a sixth step of the present modified example. By performing a cycle (in which the first step through the sixth step of the present modified example are sequentially performed in this order) at least once (that is, a predetermined number of times (n times)), the metal-containing film of a predetermined thickness is formed on the wafer 200. According to the present modified example, similar to the embodiments described above, the supply time of supplying the second reducing gas to the wafer 200 is set to be shorter than the supply time of supplying the first reducing gas to the wafer 200.

That is, according to the present modified example, the supply of the second reducing gas is started after the supply of the first reducing gas is started, the supply of the first reducing gas and the supply of the second reducing gas are performed partially in parallel, and the supply of the first reducing gas is stopped after the supply of the second reducing gas is stopped. By stopping the supply of the first reducing gas after stopping the supply of the second reducing gas according to the present modified example, it is possible to prevent (or suppress) the reaction by-products from remaining in the film. Even in such a case, it is possible to obtain substantially the same effects as those of the embodiments described with reference to FIG. 4.

Third Modified Example

According to the present modified example, as shown in FIGS. 7A and 7B, after the first step of supplying the metal-containing gas described above, the second step of removing the residual gas described above and a third step of supplying the second reducing gas of the present modified example are performed, a fourth step of supplying the first reducing gas of the present modified example and a fifth step of removing the residual gas of the present modified example are performed. Then, by performing a cycle (in which the first step through the fifth step of the present modified example are sequentially performed in this order) at least once (that is, a predetermined number of times (n times)), the metal-containing film of a predetermined thickness is formed on the wafer 200. That is, the supply of the second reducing gas and the supply of the first reducing gas are not performed in parallel but performed separately. As shown in FIG. 7A, the supply of the second reducing gas and the supply of the first reducing gas may be performed continuously. Alternatively, as shown in FIG. 7B, the inner atmosphere of the process chamber 201 may be purged by performing a residual gas removing step between the supply of the second reducing gas (that is, the third step of the present modified example) and the supply of the first reducing gas (that is, the fourth step of the present modified example). According to the present modified example, similar to the embodiments described above, the supply time of supplying the second reducing gas to the wafer 200 is set to be shorter than the supply time of supplying the first reducing gas to the wafer 200.

That is, according to the present modified example, the supply of the second reducing gas is started before the supply of the first reducing gas, and the supply of the first reducing gas is performed after the supply of the second reducing gas is performed. The present modified example will be described by way of an example in which the H2 gas is used as the first reducing gas and the PH3 gas is used as the second reducing gas. By performing a supply of the H2 gas after a supply of the PH3 gas as described above, it is possible to remove oxygen (O) and chlorine (Cl) from the adsorption layer of MoO2Cl2 or the Mo-containing layer containing chlorine (Cl) or oxygen (O). By removing the oxygen (O) and chlorine (Cl), it is possible to form the film which is easily reduced by the H2 gas. In addition, it is possible to prevent (or suppress) the PH3 gas from being diluted with the H2 gas, which can suppress the reaction described above. Further, by stopping the supply of the H2 gas after stopping the supply of the PH3 gas, it is possible to prevent (or suppress) the POCl4 serving as the reaction by-products from remaining in the film. Further, as shown in FIG. 7B, by providing a timing (which is an exhaust step) in which neither gas is supplied between the supply of the second reducing gas and the supply of the first reducing gas, it is possible to remove the by-products and an excess of the second reducing gas, and it is also possible to increase a probability of reaction between the Mo-containing layer and molecules of the H2 gas. Even in such a case, it is possible to obtain substantially the same effects as those of the embodiments described with reference to FIG. 4.

Fourth Modified Example

Figure 8:
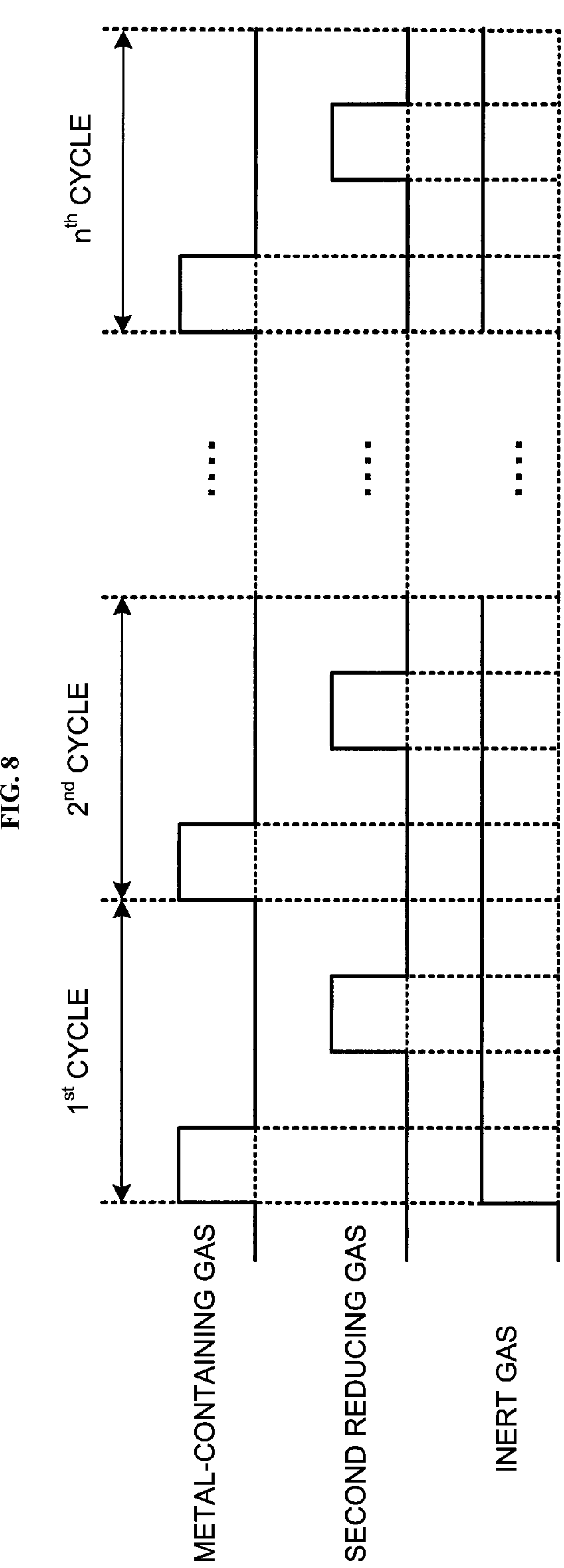
FIG. 8 is a diagram schematically illustrating a substrate processing according to a fourth modified example of the embodiments of the technique of the present disclosure.

According to the present modified example, as shown in FIG. 8, after the first step of supplying the metal-containing gas and the second step of removing the residual gas described above are performed, a third step of supplying the second reducing gas of the present modified example and a fourth step of removing the residual gas of the present modified example are performed. Then, by performing a cycle (in which the first step through the fourth step of the present modified example are sequentially performed in this order) at least once (that is, a predetermined number of times (n times)), the metal-containing film of a predetermined thickness is formed on the wafer 200. That is, according to the present modified example, the supply of the first reducing gas described above is not performed. When the MoO2Cl2 gas is as the metal-containing gas and the PH3 gas is used as the second reducing gas, by supplying the PH3 gas, it is possible to remove oxygen (O) and chlorine (Cl) from the adsorption layer of MoO2Cl2 or the Mo-containing layer containing chlorine (Cl) or oxygen (O). Even in such a case, it is possible to obtain substantially the same effects as those of the embodiments described with reference to FIG. 4.

Other Embodiments of Present Disclosure

While the technique of the present disclosure is described in detail by way of the embodiments and the modified examples described above, the technique of the present disclosure is not limited thereto. The technique of the present disclosure may be modified in various ways without departing from the scope thereof. For example, the embodiments and the modified examples described above are described by way of an example in which the MoO2Cl2 gas is used as the metal-containing gas (that is, the Mo-containing gas). However, the technique of the present disclosure is not limited thereto.

For example, the embodiments and the modified examples described above are described by way of an example in which the H2 gas is used as the first reducing gas. However, the technique of the present disclosure is not limited thereto. For example, another reducing gas such as deuterium (D2) gas and hydrogen gas containing activated hydrogen may be used as the first reducing gas.

For example, the embodiments and the modified examples described above are described by way of an example in which the PH3 gas is used as the second reducing gas. However, the technique of the present disclosure is not limited thereto. For example, another reducing gas may be used as the second reducing gas. For example, a silane-based gas such as monosilane ($SiH_4$) gas, disilane ($Si_2H_6$) gas, trisilane ($Si_3H_8$) gas and tetrasilane ($Si_4H_{10}$) gas or a borane-based gas such as monoborane ($BH_3$) gas and diborane ($B_2H_6$) gas may be used as the second reducing gas. By using the gases described above, it is possible to improve a reducing power of the Mo-containing gas. However, it may not be possible to obtain easily desorbed by-products such as the $POCl_4$ generated when the $PH_3$ gas is used, and properties of the Mo-containing film may deteriorate. Therefore, it is preferable that the $PH_3$ gas is used as the second reducing gas.

For example, the embodiments and the modified examples described above are described by way of an example in which a vertical batch type substrate processing apparatus configured to simultaneously process a plurality of substrates is used to perform the substrate processing for film formation. However, the technique of the present disclosure is not limited thereto. For example, the technique of the present disclosure may be preferably applied when a single wafer type substrate processing apparatus configured to process one or several substrates at a time is used to perform the substrate processing for film formation.

Figures 9A, 9B:
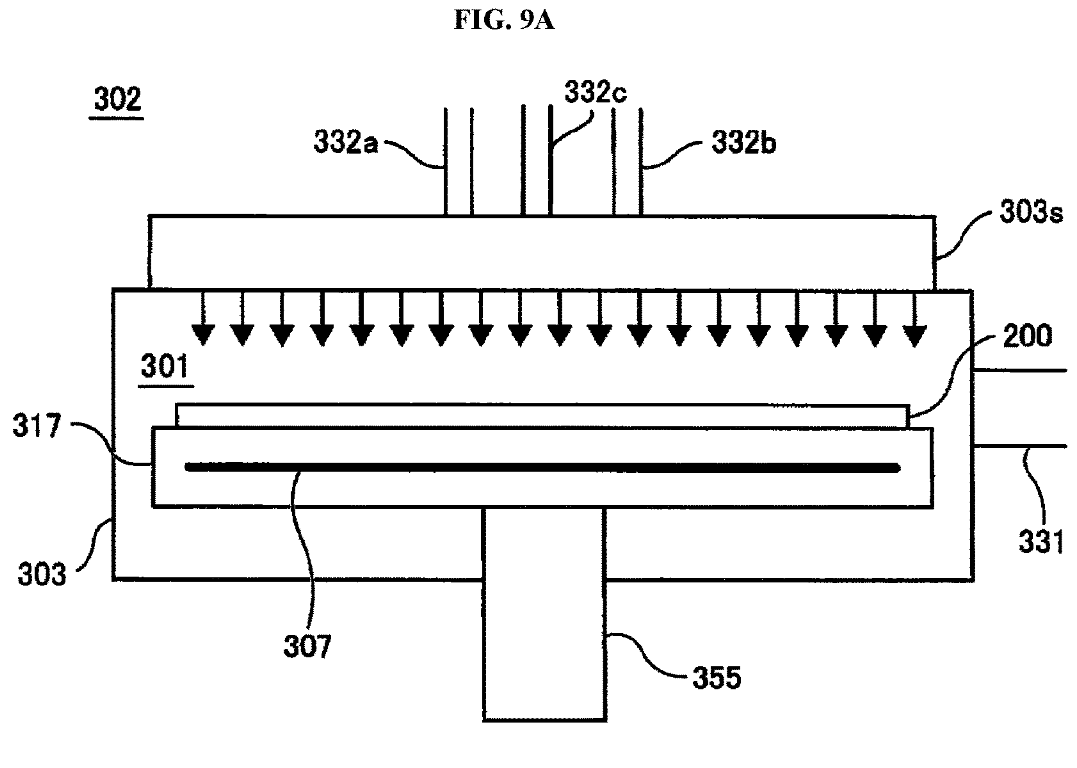
FIG. 9A is a diagram schematically illustrating a vertical cross-section of a process furnace of a substrate processing apparatus according to another embodiment of the technique of the present disclosure.
FIG. 9B is a diagram schematically illustrating a vertical cross-section of a process furnace of a substrate processing apparatus according to still another embodiment of the technique of the present disclosure.

For example, the technique of the present disclosure may be preferably applied when a film is formed by using a substrate processing apparatus including a process furnace 302 shown in FIG. 9A. The process furnace 302 may include: a process vessel 303 defining a process chamber 301 therein; a shower head 303*s* configured to shower (supply or diffuse) a gas into the process chamber 301; a support plate 317 serving as a support structure configured to support one or several wafers 200 in a horizontal orientation; a rotating shaft 355 configured to support the support plate 317 from thereunder; and a heater 307 provided in the support plate 317. A gas supply port 332*a* through which the metal-containing gas described above is supplied, a gas supply port 332*b* through which the first reducing gas described above is supplied and a gas supply port 332*c* through which the second reducing gas described above is supplied are connected to an inlet (gas introduction port) of the shower head 303*s*. A gas supplier similar to the metal-containing gas supplier of the embodiments described above is connected to the gas supply port 332*a*. A gas supplier similar to the first reducing gas supplier of the embodiments described above is connected to the gas supply port 332*b*. A gas supplier similar to the second reducing gas supplier of the embodiments described above is connected to the gas supply port 332*c*. A gas distribution plate (not shown) configured to shower the gas into the process chamber 301 is provided at an outlet (gas discharge port) of the shower head 303*s*. An exhaust port 331 through which an inner atmosphere of the process chamber 301 is exhausted is provided at the process vessel 303. An exhauster (not shown) similar to the exhauster of the embodiments described above is connected to the exhaust port 331.

For example, the technique of the present disclosure may be preferably applied when a film is formed by using a substrate processing apparatus including a process furnace 402 shown in FIG. 9B. The process furnace 402 may include: a process vessel 403 defining a process chamber 401; a support plate 417 serving as a support structure configured to support one or several wafers 200 in a horizontal orientation; a rotating shaft 455 configured to support the support plate 417 from thereunder; a lamp heater 407 configured to irradiate light to the wafer 200 or the wafers 200 in the process vessel 403; and a quartz window 403*w* through which the light of the lamp heater 407 is transmitted. A gas supply port 432*a* through which the metal-containing gas described above is supplied, a gas supply port 432*b* through which the first reducing gas described above is supplied and a gas supply port 432*c* through which the second reducing gas described above is supplied are connected to the process vessel 403. A gas supplier similar to the metal-containing gas supplier of the embodiments described above is connected to the gas supply port 432*a*. A gas supplier similar to the first reducing gas supplier of the embodiments described above is connected to the gas supply port 432*b*. A gas supplier similar to the second reducing gas supplier of the embodiments described above is connected to the gas supply port 432*c*. An exhaust port 431 through which an inner atmosphere of the process chamber 401 is exhausted is provided at the process vessel 403. An exhauster (not shown) similar to the exhauster of the embodiments described above is connected to the exhaust port 431.

When the substrate processing apparatuses described above with reference to FIGS. 9A and 9B are used to perform the substrate processing for film formation, the sequences and process conditions may be substantially the same as those of the embodiments described above.

It is preferable that the process recipe (that is, a program defining parameters such as the process sequences and the process conditions of the substrate processing) used to form the various films described above is prepared individually in accordance with the contents of the substrate processing such as a type of the film to be formed, a composition ratio of the film, a quality of the film, a thickness of the film, the process sequences and the process conditions of the substrate processing. That is, a plurality of process recipes are prepared. When starting the substrate processing, an appropriate process recipe is preferably selected among the process recipes in accordance with the contents of the substrate processing. Specifically, it is preferable that the process recipes are stored (installed) in the memory 121*c* of the substrate processing apparatus in advance via an electric communication line or the recording medium (for example, the external memory 123) storing the process recipes prepared individually in accordance with the contents of the substrate processing. Then, when starting the substrate processing, the CPU 121*a* preferably selects the appropriate process recipe among the process recipes stored in the memory 121*c* of the substrate processing apparatus in accordance with the contents of the substrate processing. Thus, various films of different types, different composition ratios, different qualities and different thicknesses may be universally formed with a high reproducibility using a single substrate processing apparatus. In addition, since a burden on an operator such as inputting the process sequences and the process conditions may be reduced, various processes can be performed quickly while avoiding a malfunction of the apparatus.

The technique of the present disclosure may be implemented by changing an existing process recipe stored in the substrate processing apparatus to a new process recipe. When changing the existing process recipe to the new process recipe, the new process recipe may be installed in the substrate processing apparatus via the electric communication line or the recording medium storing the process recipes. Alternatively, the existing process recipe already stored in the substrate processing apparatus may be directly changed to the new process recipe according to the technique of the present disclosure by operating the input/output device of the substrate processing apparatus.

As described above, while the technique of the present disclosure is described in detail by way of the embodiments and the modified examples described above, the technique of the present disclosure is not limited thereto. The technique of the present disclosure may be modified in various ways without departing from the scope thereof.

According to some embodiments of the present disclosure, it is possible to improve at least one of the electrical properties or the throughput of the metal-containing film.

What is claimed is:

1. A substrate processing method comprising:

(a) supplying a metal-containing gas containing molybdenum, oxygen and chlorine to a substrate;

(b) supplying a gas constituted by hydrogen to the substrate;

(c) supplying a gas, which is different from the gas constituted by hydrogen, containing hydrogen and an element other than hydrogen to the substrate; and (d) forming a metal-containing film on the substrate by performing (a), (b) and (c) at least once.

2. The substrate processing method of claim 1, wherein (b) and (c) are performed in a manner partially in parallel in time.

3. The substrate processing method of claim 1, wherein (b) and (c) are started simultaneously.

4. The substrate processing method of claim 3, wherein (b) is terminated after (c) is terminated.

5. The substrate processing method of claim 1, wherein (b) is started after (c) is started.

6. The substrate processing method of claim 5, wherein (b) is terminated after (c) is terminated.

7. The substrate processing method of claim 1, wherein (c) is started after (b) is started.

8. The substrate processing method of claim 7, wherein (b) is terminated after (c) is terminated.

9. The substrate processing method of claim 1, wherein (c) is performed while performing (b).

10. The substrate processing method of claim 1, wherein (b) is performed after (c) is performed.

11. The substrate processing method of claim 1, wherein a process time of (b) is longer than a process time of (c).

12. The substrate processing method of claim 1, wherein the metal-containing gas comprises molybdenum dichloride dioxide ($MoO_2Cl_2$) gas.

13. The substrate processing method of claim 12, wherein the gas containing hydrogen and the element other than hydrogen comprises phosphine (PH3) gas.

14. The substrate processing method of claim 1, wherein the gas constituted by hydrogen comprises $H_2$ gas.

15. The substrate processing method of claim 14, wherein the gas containing hydrogen and the element other than hydrogen comprises phosphine (PH3) gas.

16. The substrate processing method of claim 1, wherein the gas containing hydrogen and the element other than hydrogen comprises phosphine (PH3) gas.

17. A method of manufacturing a semiconductor device, comprising the substrate processing method of claim 1.

18. A non-transitory computer-readable recording medium storing a program that causes a substrate processing apparatus, by a computer, to perform:

(a) supplying a metal-containing gas containing molybdenum, oxygen and chlorine to a substrate;

(b) supplying a gas constituted by hydrogen to the substrate;

(c) supplying a gas, which is different from the gas constituted by hydrogen, containing hydrogen and an element other than hydrogen to the substrate; and (d) forming a metal-containing film on the substrate by performing (a), (b) and (c) performed at least once.

* * * * *